US010985745B1

(12) United States Patent
Nojima et al.

(10) Patent No.: US 10,985,745 B1
(45) Date of Patent: Apr. 20, 2021

(54) DRIVERS FOR POWER SEMICONDUCTOR SWITCHES USING DEVICE FEEDBACK

(71) Applicant: Eaton Intelligent Power Limited, Dublin (IE)

(72) Inventors: Geraldo Nojima, Fort Mill, SC (US); Eddie Wilkie, Fletcher, NC (US)

(73) Assignee: Eaton Intelligent Power Limited

( * ) Notice: Subject to any disclaimer, the term of this patent is extended or adjusted under 35 U.S.C. 154(b) by 0 days.

(21) Appl. No.: 16/785,050

(22) Filed: Feb. 7, 2020

(51) Int. Cl.
*H03K 17/082* (2006.01)

(52) U.S. Cl.
CPC ............................ *H03K 17/0822* (2013.01)

(58) Field of Classification Search
CPC ............. H03K 17/687; H03K 17/6871; H03K 17/6872
See application file for complete search history.

(56) References Cited

U.S. PATENT DOCUMENTS

| | | | | |
|---|---|---|---|---|
| 5,909,135 A | * | 6/1999 | Baldwin | ............ H03K 17/0822 327/328 |
| 8,963,585 B2 | * | 2/2015 | Lobsiger | ............... H02M 1/088 327/108 |

OTHER PUBLICATIONS

Ghorbani et al.; *A Simple Closed-Loop Active Gate Voltage Driver for Controlling $di_c/dt$ and $dv_{CE}/dt$ in IGBTs*; Electronics (2019) 8, 144; pp. 1-18.

* cited by examiner

*Primary Examiner* — Hai L Nguyen
(74) *Attorney, Agent, or Firm* — Stanek Lemon Crouse & Meeks, P.A.

(57) ABSTRACT

An apparatus includes a plurality of parallel-connected semiconductor switches (e.g., wide bandgap transistors) and a plurality of driver circuits having outputs configured to be coupled to control terminals of respective ones of the plurality of semiconductor switches and configured to drive the parallel-connected semiconductor switches responsive to a common switch state control signal. The apparatus further includes a control circuit configured to sense respective states of respective ones of the parallel-connected semiconductor switches and to control respective ones of the driver circuits responsive to respective ones of the sensed states.

18 Claims, 5 Drawing Sheets

DRIVERS FOR POWER SEMICONDUCTOR SWITCHES USING DEVICE FEEDBACK

BACKGROUND

The inventive subject matter relates to electrical power apparatus and methods and, more particularly, to driver circuits for power semiconductor switches.

Semiconductor switches, such as insulated gate bipolar transistors (IGBTs) and power metal-oxide-semiconductor field-effect transistors (MOSFETs), are used in a variety of different types of electrical power applications, such as in rectifiers, inverters, motor drives and the like. Solid state circuit breakers incorporating such semiconductor switches have also been developed, with the semiconductor switches being used to replace the electromechanical switches traditionally used in such devices. In such applications, semiconductor switches offer advantages of speed and resistance to environmental degradation.

In some applications, it is desirable to operate multiple semiconductor switches in parallel in order to increase current carrying capacity. However, relatively small disparities in device parameters, such as turn-on resistance and threshold voltage, can lead to nonuniform current distribution among the paralleled devices. Such current maldistribution can lead to device overload and failure. Such problems can be particularly acute for wide bandgap semiconductor switches, such as silicon carbide (SiC) power transistors, which may be operated at switching frequencies and/or voltage levels that are significantly greater than those used for conventional silicon devices.

SUMMARY

Some embodiments of the inventive subject matter provide an apparatus including a plurality of parallel-connected semiconductor switches (e.g., wide bandgap transistors) and a plurality of driver circuits having outputs configured to be coupled to control terminals of respective ones of the plurality of semiconductor switches and configured to drive the parallel-connected semiconductor switches responsive to a common switch state control signal. The apparatus further includes a control circuit configured to sense respective states of respective ones of the parallel-connected semiconductor switches and to control respective ones of the driver circuits responsive to respective ones of the sensed states.

In some embodiments, the driver circuits may have respective different power supplies and the control circuit may be configured to control respective ones of the power supplies responsive to respective ones of the sensed states. The semiconductor switches may include respective MOSFETs, the driver circuit may comprise respective totem-pole circuits, and the control circuit may be configured to sense respective on-state voltages of respective ones of the MOSFETs and to responsively control respective ones of the power supplies responsive to respective ones of the sensed on-state voltages.

According to further aspects, the control circuit may include respective sensor circuits for respective ones of the MOSFETs. Each sensor circuit may include a resistor and a zener diode coupled in series across one of the MOSFETs and an amplifier configured to detect a voltage across the zener diode.

In some embodiments, the driver circuits may include respective output resistors coupled to respective ones of the semiconductor switches and the control circuit may be configured to control respective ones of the output resistors responsive to respective ones of the sensed states. The semiconductor switches may include respective MOSFETs and the control circuit may be configured to sense respective on/off transitions of respective ones of the MOSFETs and to responsively control respective ones of the output resistors responsive to respective ones of the sensed transitions.

According to further aspects, the control circuit may include respective sensor circuits for respective ones of the MOSFETs. Each sensor circuit may include at least one zener diode coupled in series with a resistor across one of the MOSFETs and a comparator circuit configured to generate a state transition signal responsive to a voltage across the resistor.

In further embodiments, the control circuit may include a plurality of sensor circuits configured to generate first sensor signals indicative of respective states of respective ones of the transistors, a first communications circuit configured to transmit a communications signal over a serial communications link responsive to the first sensor signals, a second communications circuit configured to receive the transmitted communications signal and to recover respective second sensor signals corresponding to respective ones of the first sensor signals therefrom, and driver control circuit configured to control respective ones of the driver circuits responsive to respective ones of the second sensor signals. The serial communications link may include a fiber optic link.

Some embodiments provide an apparatus including a driver circuit having an output configured to be coupled to a gate terminal of a field effect transistor (FET) and a control circuit configured to sense at least one of an on-state voltage and an on/off transition of the FET and to control the driver circuit responsive to the sensed at least one of an on-state voltage and an on/off transition. The control circuit may include a sensor circuit configured to generate a first sensor signal indicative of a state of the FET, a first communications circuit configured to transmit a communications signal over a serial communications link responsive to the first sensor signal, a second communications circuit configured to receive the transmitted communications signal and to recover a second sensor signal corresponding to the first sensor signal therefrom, and a driver control circuit configured to the driver circuit responsive to the second sensor signal. The serial communications link may include a fiber optic link.

In further embodiments, the control circuit may include a sensor circuit configured to detect an on-state voltage of the FET and a driver control circuit configured to control a power supply of the driver circuit responsive to the detected on-state voltage. The sensor circuit may include a resistor and a zener diode coupled in series with the FET and an amplifier configured to detect a voltage across the zener diode.

In still further embodiments, the driver circuit may include an output resistor coupled to the gate terminal of the FET and the control circuit may include a sensor circuit configured to detect an on/off transition of the FET and a driver control circuit configured to control the output resistor responsive to the detected on/off transition. The sensor circuit may include at least one zener diode coupled in series with a resistor across the FET and a comparator circuit configured to generate a state transition signal responsive to a voltage across the resistor.

In still further embodiments, an apparatus includes a plurality of parallel-connected wide-bandgap semiconductor transistors, a plurality of totem-pole amplifier circuits having outputs configured to be coupled to control terminals of respective ones of the semiconductor switches and configured to operate responsive to a common drive signal, a control circuit configured to sense respective states of respective ones of the parallel-connected transistors and to control respective ones of the amplifier circuits responsive to respective ones of the sensed states. The control circuit may be configured to control power supply voltages and/or output resistors of the amplifier circuits responsive to the sensed states. The control circuit may be configured to control power supply voltages of the amplifier circuits responsive to sensed on-state voltages of the transistors and/or to control output resistors of the amplifier circuits responsive to sensed on/off transitions of the transistors.

DETAILED DESCRIPTION

Figure 1:
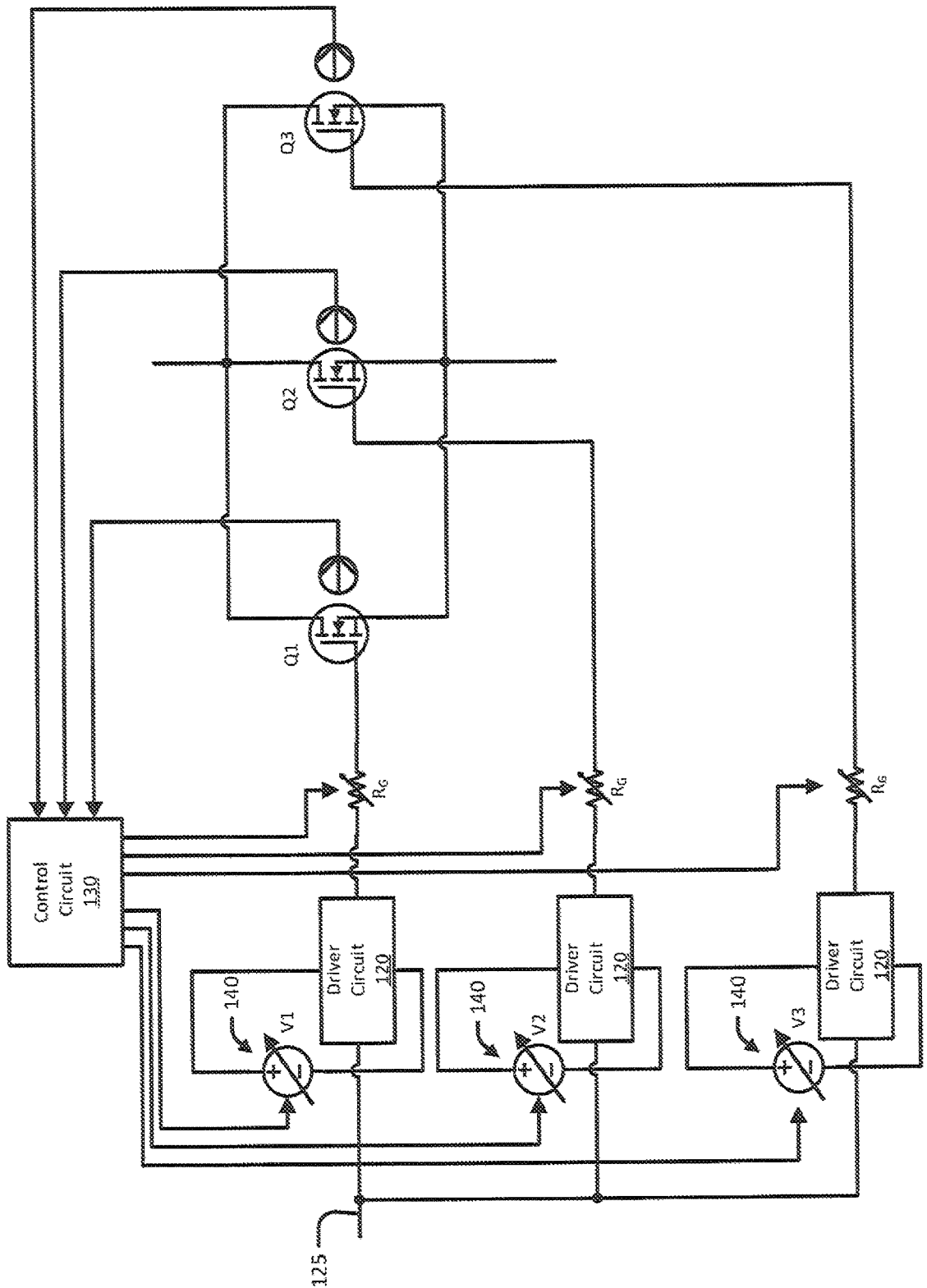
FIG. 1 is a schematic diagram of a driver circuit for parallel-connected semiconductor switching devices according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from a realization that closed-loop control of current distribution and switching times of parallel-connected power semiconductor switching devices may be particularly advantageous in certain applications, such as in applications employing parallel-connected wide-bandgap semiconductor switching devices (e.g., SiC-based power MOSFETs and similar devices). According to some aspects, parameters of such devices may be sensed and used to implement feedback control of driver circuits that are used to control the power semiconductor switching devices. For example, in some embodiments, on-state voltages of parallel-connected power transistors may be sensed and used to control the power supply voltages applied to gate drivers for the transistors to enable control of the on-state voltages. In further embodiments, on/off transition times of such transistors may be sensed and used to adjust output resistors of the gate drivers to control the relative switching times of the transistors. Using such techniques, current distribution among the parallel-connected devices can be made more uniform.

FIG. 1 illustrates driver circuitry for driving parallel-connected transistors Q1, Q2, Q3 according to some embodiments. The transistors Q1, Q2, Q3 may be, for example, SiC power MOSFETs or other wide bandgap semiconductor switching devices. The transistors Q1, Q2, Q3 may correspond to discretely packaged transistors or to respective groups of transistors, such as groups of transistors in multi-transistor modules.

The transistors Q1, Q2, Q3 are driven by respective gate driver circuits 120 responsive to a common switch state control signal 125. The common switch state control signal 125 represents a command to selectively place the transistors Q1, Q2, Q3 into an "on" state and an "off" state. The switch state control signal 125 may be generated, for example, by a control circuit for an apparatus, such as a power converter (e.g., an inverter or rectifier), solid-state circuit breaker, static switch or the like, that includes the transistors Q1, Q2, Q3.

As further shown, the gate driver circuits 120 are coupled to respective different power supply circuits 140. The power supply circuits 140 apply independently controllable power supply voltages V1, V2, V3 to respective ones of the gate driver circuits 120. A control circuit 130 controls the power supply circuits 140 responsive to sensor signals representative of operating states of respective ones of the transistors Q1, Q2, Q3. For example, as explained in detail below, the control circuit 130 may vary the power supply voltages V1, V2, V3 provided by the power supply circuits 140 responsive to sensor signals representing on-state voltages of the respective transistors Q1, Q2, Q3 to thereby adjust of the on-state voltages of the transistors Q1, Q2, Q3.

The gate driver circuits 120 are coupled to gate terminals of the transistors Q1, Q2, Q3 by respective variable output resistors $R_G$. As shown, the control circuit 130 may control the variable output resistors $R_G$ responsive to sensor signals associated with respective ones of the transistors Q1, Q2, Q3. For example, as explained below, the control circuit 130 may selectively control the output resistors $R_G$ responsive to sensed on/off transitions of the transistors Q1, Q2, Q3 to thereby align "on" and "off" periods of the transistors Q1, Q2, Q3.

Figure 2:
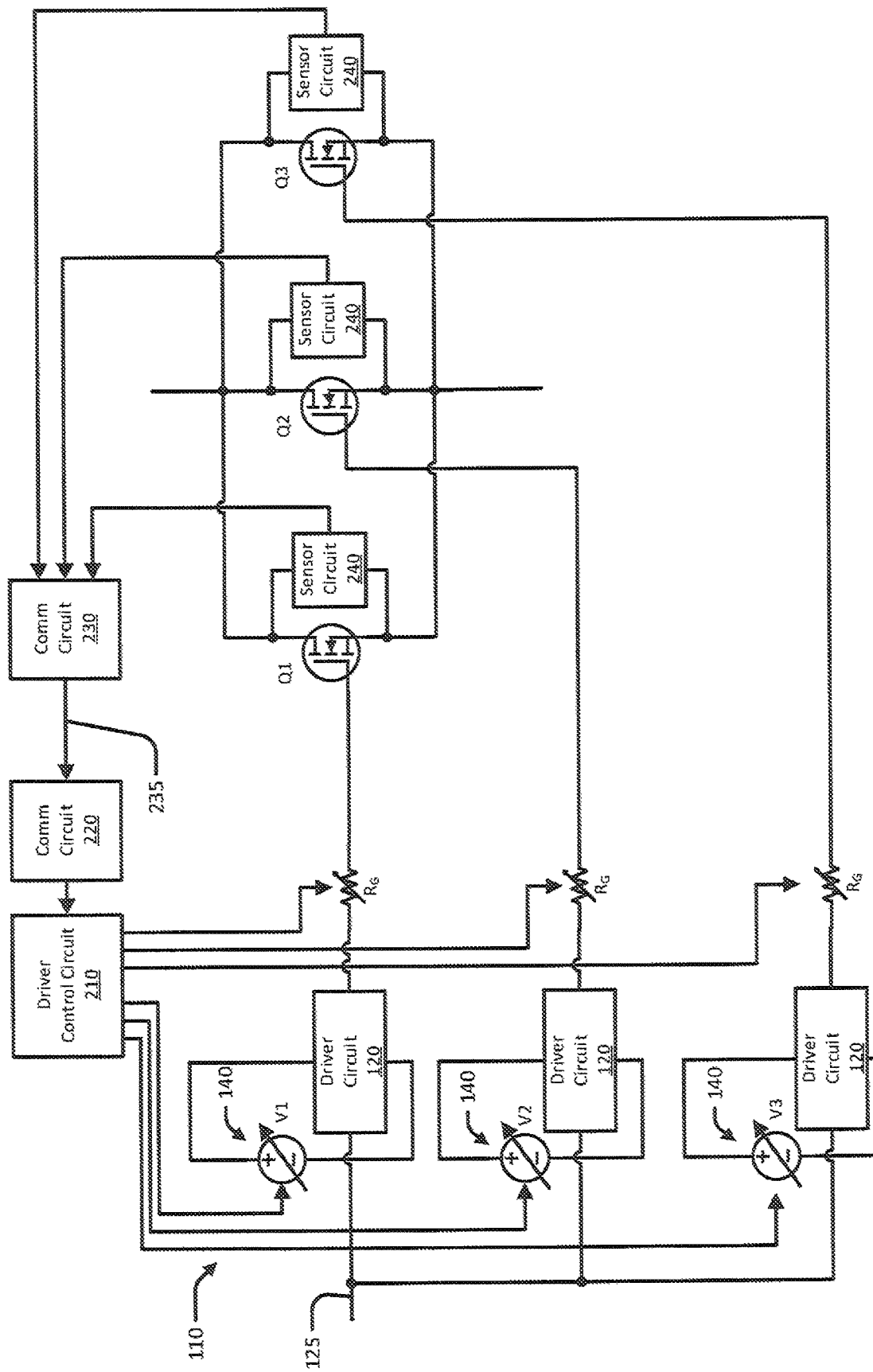
FIG. 2 is a schematic diagram of a driver circuit for parallel-connected semiconductor switching devices according to further embodiments.

FIG. 2 illustrates driver circuitry for driving parallel-connected MOSFETs Q1, Q2, Q3 according to further embodiments. Respective sensor circuits 240 are configured to generate sensor signals corresponding to parameters of the respective transistors Q1, Q2, Q3. For example, the sensor signals may indicate on-state voltages and/or on/off transition times along the lines discussed above. The sensor signals are provided to a first communications circuit 230, which transmits a communication signal 235 including signals corresponding to the sensor signals. The communications signal 235 is received by a second communications circuit 220, which may extract sensor signals corresponding to the original sensor signals generated by the sensor circuits 240. This extracted information may be provided to a driver control circuit 210, which responsively controls power supplies 140 and output resistors $R_{G1}$, $R_{G2}$, $R_{G3}$ in a manner along the lines discussed above.

The communications signal 235 may be a serial communications signal. The first and second communications circuits 230, 220 may include, for example, respective components of a serializer/deserializer (SERDES) chipset, wherein the first communications circuit 230 multiplexes data corresponding to the sensor signals from the sensor circuits 240 to generate the communications signal 235 as a serial communications signal, which is received and demultiplexed by the second communications circuit 220. The communications signal 235 may transmitted, for example, over a serial fiber optic link that provides galvanic isolation between the components coupled to the transistors Q1, Q2, Q3 and the control circuitry, such as the driver control circuit 210.

Figure 3:
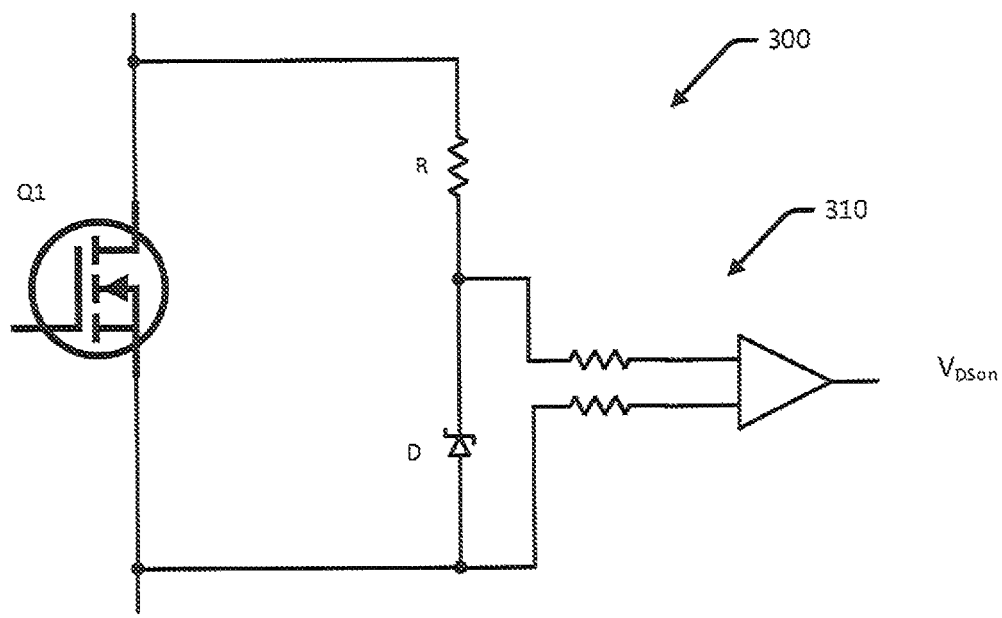
FIG. 3 is a schematic diagram of an on-state voltage sensor circuit for a semiconductor switch according to some embodiments.

FIG. 3 illustrates a sensor circuit 300 that may be used to detect an on-state voltage of a transistor Q1, which can, in turn, be used to control on-state resistance of the transistor Q1 when used, for example, in the parallel-connected arrangements of FIGS. 1 and 2. The sensor circuit 300 includes a zener diode D connected in series with a resistor R between source and drain terminals of the transistor Q1. An amplifier circuit 310 amplifies a voltage across the zener diode D to generate a sensor signal $V_{DS}$, which can indicate an on-state voltage of the transistor Q1.

In particular, when the transistor Q1 is off, there may be a voltage (e.g., a power supply voltage for a converter including the transistor Q1) substantially greater than the reverse breakdown voltage of the zener diode D across the transistor Q1. This results in the voltage across the zener diode D being clamped at the reverse breakdown voltage of the zener diode D, thus preventing damage to the amplifier circuit 310. When the transistor Q1 is on, however, the on-state voltage across the transistor Q1 is less than the reverse breakdown voltage of the zener diode D, causing the on-state voltage to be applied to the input of the amplifier circuit 310. Thus, when the transistor Q1 is on, the sensor signal $V_{DS}$ represents the on-state voltage of the transistor Q1.

The voltage signal $V_{DS}$ in this state can be used to adjust the power supply voltage applied to the gate driver circuit that is driving the transistor Q1. In particular, if the on-state voltage sensor signal $V_{DS}$ indicates a greater than desired on-state voltage (and, thus, a greater than desired on-state resistance), the power supply voltage applied to the gate driver circuit can be increased to increase the voltage applied to the gate terminal of the transistor Q1, driving it further into saturation and reducing the on-state voltage. Conversely, if the on-state voltage sensor signal $V_{DS}$ indicates a less than desired on-state voltage (and, thus, a less than desired on-state resistance), the power supply voltage applied to the gate driver circuit can be reduced to reduce the voltage applied to the gate terminal of the transistor Q and thereby increase the on-state voltage. In the parallel-connected transistor arrangements shown in FIGS. 1 and 2, this feedback control scheme can be used with each of the transistors Q1, Q2, Q3 to help equalize the on-state currents carried by the transistors Q1, Q2, Q3 and thus reduce undesirable effects associated with current imbalances.

Figure 4:
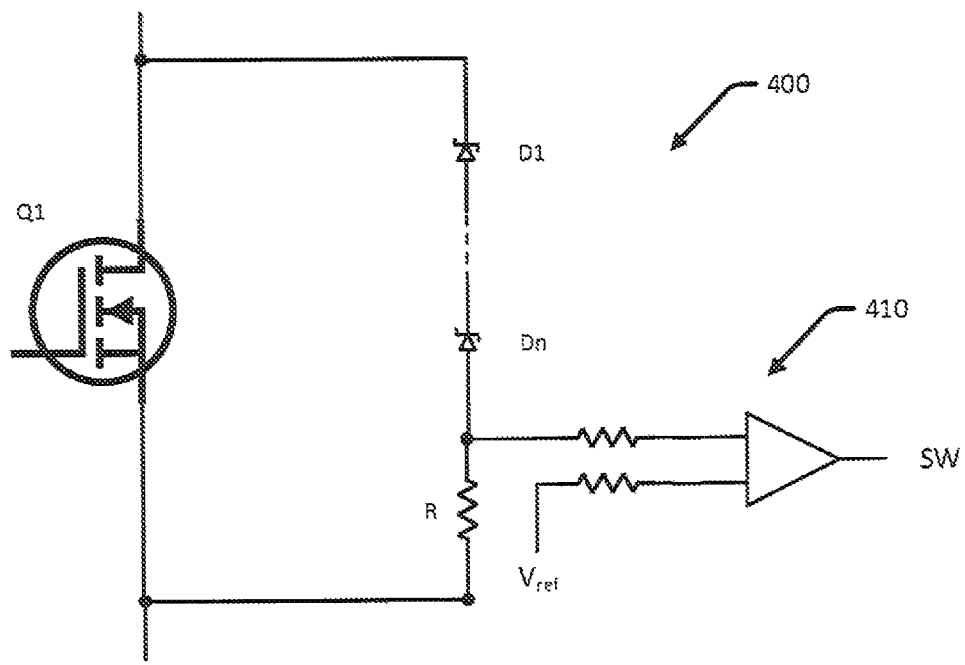
FIG. 4 is a schematic diagram of a switch state sensor circuit for a semiconductor switch according to some embodiments.

FIG. 4 illustrates a sensor circuit 400 that may be used to detect on/off transition times of a transistor Q1, which can be used to control an output resistance of a gate driver circuit coupled to the transistor Q1. The sensor circuit 400 includes a plurality of diodes D1, . . . , Dn connected in series with a resistor R between source and drain terminals of the transistor Q1. A comparator circuit 410 compares a voltage across the resistor R to a reference voltage $V_{ref}$. When the transistor Q1 is off, the voltage across the resistor R is greater than the reference voltage Vref, causing a sensor signal SW output by the comparator circuit 410 to have first state (e.g., a "1"). When the transistor Q1 is on, the voltage across the resistor R is less than the reference voltage, causing the sensor signal SW to have a second state (e.g., a "0"). In a parallel-connected arrangement such as those illustrated in FIGS. 1 and 2, the times of transitions of the transistors Q1, Q2, Q3 detected in this manner can be compared to detect, for example, misalignment of the times at which the transistors Q1, Q2, Q3 are on. This information can be used to adjust output resistors of the gate driver circuits for the transistors Q1, Q2, Q3 to more closely align the turn-on and turn-off times of the transistors Q1, Q2, Q3. This can further reduce current imbalances among the transistors Q1, Q2, Q3.

Figure 5:
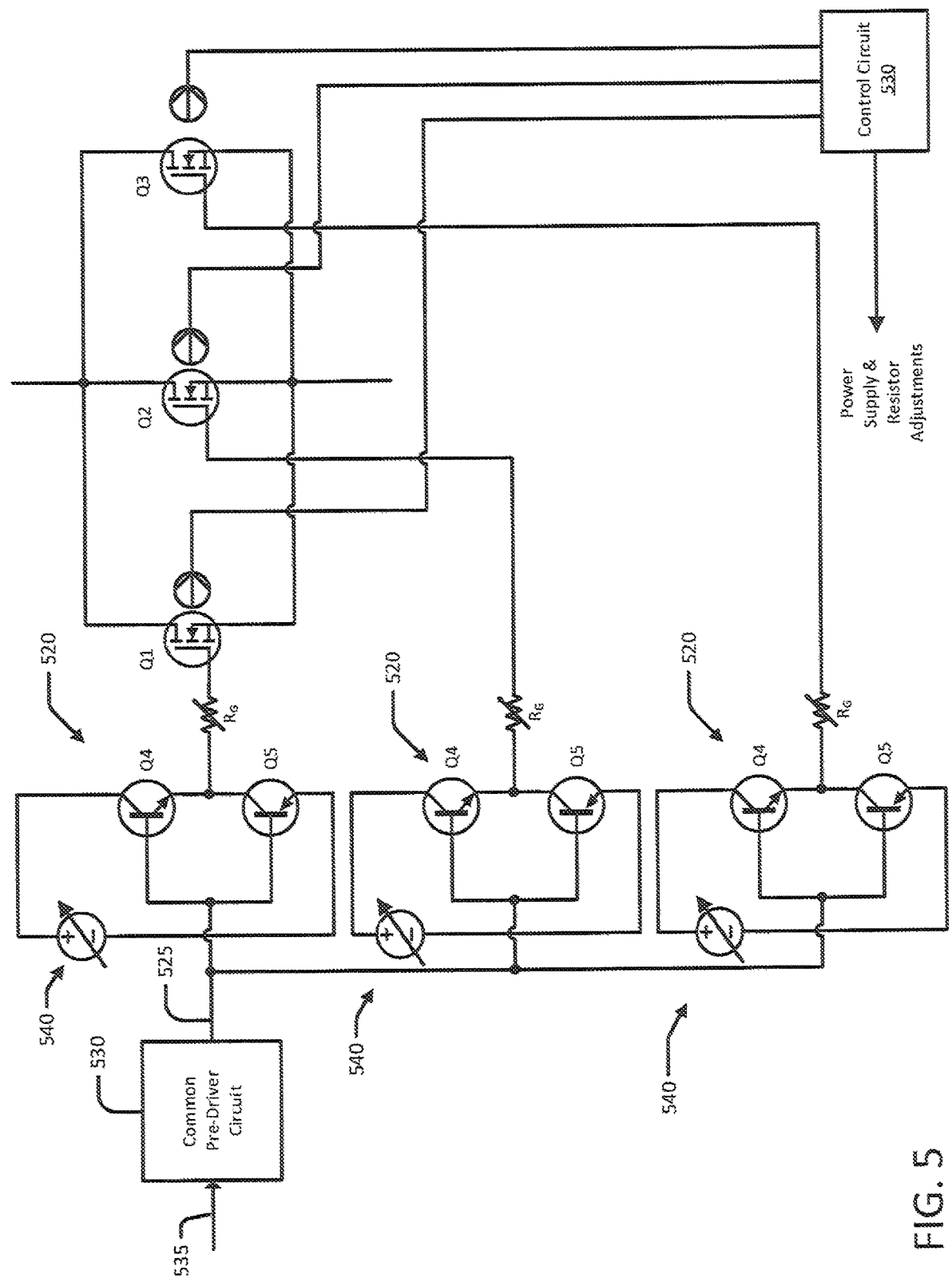
FIG. 5 is a schematic diagram illustrating a driver circuit for parallel-connected multi-transistor modules according to further embodiments.

FIG. 5 illustrates driver circuitry for parallel-connected transistors Q1, Q2, Q3 according to further embodiments. In the illustrated circuitry, gate driver circuits for parallel-connected transistors Q1, Q2, Q3 include totem-pole push-pull circuits 520, which are coupled to gate terminals of respective ones of the transistors Q1, Q2, Q3 by respective variable output transistors $R_G$. Responsive to a first drive signal 535, a common pre-driver circuit 530 generates a drive signal 525 that is applied in common to the totem-pole circuits 520 such that they drive the transistors Q1, Q2, Q3 substantially in unison. As further shown, the totem pole circuits 520 are connected to respective power supply circuits 540 that apply respective power supply voltages $V_1$, $V_2$, $V_3$ to the respective totem-pole circuits 520. A control circuit 530 is configured to control the power supply circuit 540 and the output resistors $R_G$ responsive to sensed parameters of the parallel-connected transistors Q1, Q2, Q3, thus providing means for adjusting, for example, on-state resistances and on/off times of the transistors Q1, Q2, Q3 to provide increased uniformity in current sharing among the transistors Q, Q2, Q3. For example, the power supply circuits 540 may be controlled responsive to sensed on-state voltages of the transistors Q1, Q2, Q3 and the output resistors $R_G$ may be controlled responsive to sensed on-off transition times of the transistors Q1, Q2, Q3.

Figure 6:
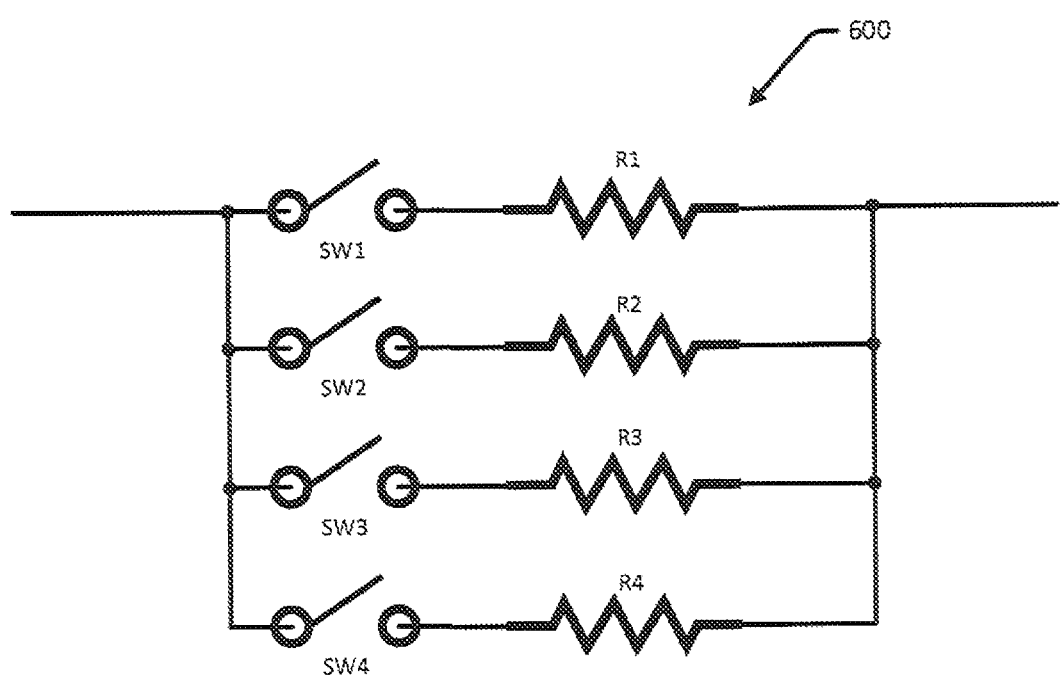
FIG. 6 is a schematic diagram illustrating a variable resistor circuit for a driver circuit according to some embodiments.

An example of a variable resistor circuit 600 that might be used for the output resistors $R_G$ in the embodiments of FIGS. 1, 2 and 5 is illustrated in FIG. 6. The variable resistor circuit 600 includes a plurality of resistors R1, R2, R3, R4 that may be selectively connected in parallel by a plurality of switches SW1, SW3, SW3, SW4 to provide a variety of different resistances. The switches SW1, SW2, SW3, SW4 may be controlled responsive to feedback from a semiconductor switching device, along the lines discussed above with reference to FIGS. 1-5. It will be appreciated that the circuitry shown in FIG. 6 is provided for purposes of illustration, and that other circuit arrangements may be used to provide a variable resistance.

As noted above, driver circuitry along the lines described with reference to FIGS. 1-6 may be used in any of a variety of applications. For example, driver circuitry as described above may be used for control of parallel-connected semiconductor switches in power converters (e.g., inverters and rectifiers), motor drives, solid-state circuit interrupters, and a host of other applications that use power semiconductor switching devices. It will be appreciated that driver circuitry as described herein may be particularly advantageous when employed with parallel-connected wide-bandgap semiconductor switching devices, such as SiC power transistors, for which precise switching and current sharing may be particularly important.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   a plurality of parallel-connected semiconductor switches;
   a plurality of driver circuits having outputs configured to be coupled to control terminals of respective ones of the plurality of parallel-connected semiconductor switches and configured to drive the parallel-connected semiconductor switches responsive to a common switch state control signal, wherein the plurality of driver circuits comprise respective output resistors coupled to respective ones of plurality of parallel-connected the semiconductor switches; and
   a control circuit configured to sense respective states of respective ones of the plurality of parallel-connected semiconductor switches and to control the respective output resistors responsive to respective ones of the sensed states.

2. The apparatus of claim 1
   wherein the semiconductor switches comprise respective MOSFETs; and
   wherein the control circuit is configured to sense respective on/off transitions of respective ones of the MOSFETs and to responsively control respective ones of the output resistors responsive to respective ones of the sensed transitions.

3. The apparatus of claim 2, wherein the control circuit comprises respective sensor circuits for respective ones of the MOSFETs, each sensor circuit comprising:
   at least one zener diode coupled in series with a resistor across one of the MOSFETs; and
   a comparator circuit configured to generate a state transition signal responsive to a voltage across the resistor.

4. The apparatus of claim 1, wherein the control circuit comprises:
   a plurality of sensor circuits configured to generate first sensor signals indicative of respective states of respective ones of the transistors;
   a first communications circuit configured to transmit a communications signal over a serial communications link responsive to the first sensor signals;
   a second communications circuit configured to receive the transmitted communications signal and to recover respective second sensor signals corresponding to respective ones of the first sensor signals therefrom; and
   a driver control circuit configured to control respective ones of the driver circuits responsive to respective ones of the second sensor signals.

5. The apparatus of claim 4, wherein the serial communications link comprises a fiber optic link.

6. The apparatus of claim 1, wherein the semiconductor switches comprise respective wide-bandgap transistors.

7. An apparatus comprising:
   a plurality of parallel-connected semiconductor switches;
   a plurality of driver circuits having outputs configured to be coupled to control terminals of respective ones of the plurality of parallel-connected semiconductor switches and configured to drive the plurality of parallel-connected semiconductor switches responsive to a common switch state control signal; and
   a control circuit configured to sense respective states of respective ones of the plurality of parallel-connected semiconductor switches and to control respective ones of the plurality of driver circuits responsive to respective ones of the sensed states,
   wherein the driver circuits have respective different power supplies and wherein the control circuit is configured to control respective ones of the power supplies responsive to respective ones of the sensed states.

8. The apparatus of claim 7,
   wherein the semiconductor switches comprise respective MOSFETs;
   wherein the driver circuit comprise respective totem-pole circuits; and
   wherein the control circuit is configured to sense respective on-state voltages of respective ones of the MOSFETs and to responsively control respective ones of the power supplies responsive to respective ones of the sensed on-state voltages.

9. The apparatus of claim 8, wherein the control circuit comprises respective sensor circuits for respective ones of the MOSFETs, each sensor circuit comprising:
   a resistor and a zener diode coupled in series across one of the MOSFETs; and
   an amplifier configured to detect a voltage across the zener diode.

10. An apparatus comprising:
    a driver circuit having an output configured to be coupled to a gate terminal of a field effect transistor (FET); and
    a control circuit configured to sense at least one of an on-state voltage and an on/off transition of the FET and to control the driver circuit responsive to the sensed at least one of an on-state voltage and an on/off transition, wherein the control circuit comprises:
    a sensor circuit configured to generate a first sensor signal indicative of a state of the FET;
    a first communications circuit configured to transmit a communications signal over a serial communications link responsive to the first sensor signal;
    a second communications circuit configured to receive the transmitted communications signal and to recover a second sensor signal corresponding to the first sensor signal therefrom; and
    a driver control circuit configured to the driver circuit responsive to the second sensor signal.

11. The apparatus of claim 10, wherein the serial communications link comprises a fiber optic link.

12. The apparatus of claim 10, wherein the control circuit comprises:
    a sensor circuit configured to detect the on-state voltage of the FET; and a driver control circuit configured to control a power supply of the driver circuit responsive to the detected on-state voltage.

13. The apparatus of claim 12, wherein the sensor circuit comprises:
    a resistor and a zener diode coupled in series with the FET; and
    an amplifier configured to detect a voltage across the zener diode.

14. The apparatus of claim 10:
    wherein the driver circuit comprises an output resistor coupled to the gate terminal of the FET; and
    wherein the control circuit comprises:
        a sensor circuit configured to detect an on/off transition of the FET; and
        a driver control circuit configured to control the output resistor responsive to the detected on/off transition.

15. The apparatus of claim 14, wherein the sensor circuit comprises:
    at least one zener diode coupled in series with a resistor across the FET; and
    a comparator circuit configured to generate a state transition signal responsive to a voltage across the resistor.

16. An apparatus comprising:
    a plurality of parallel-connected wide-bandgap semiconductor transistors;
    a plurality of totem-pole amplifier circuits having outputs configured to be coupled to control terminals of respective ones of the semiconductor switches and configured to operate responsive to a common drive signal; and
    a control circuit configured to sense respective states of respective ones of the parallel-connected transistors and to control respective ones of the amplifier circuits responsive to respective ones of the sensed states.

17. The apparatus of claim 16, wherein the control circuit is configured to control power supply voltages and/or output resistors of the amplifier circuits responsive to the sensed states.

18. The apparatus of claim 17, wherein the control circuit is configured to control power supply voltages of the amplifier circuits responsive to sensed on-state voltages of the transistors and/or to control output resistors of the amplifier circuits responsive to sensed on/off transitions of the transistors.

* * * * *

UNITED STATES PATENT AND TRADEMARK OFFICE
CERTIFICATE OF CORRECTION

PATENT NO. : 10,985,745 B1
APPLICATION NO. : 16/785050
DATED : April 20, 2021
INVENTOR(S) : Nojima et al.

Page 1 of 1

It is certified that error appears in the above-identified patent and that said Letters Patent is hereby corrected as shown below:

In the Specification

Column 6, Line 2: Please correct "of the transistor Q" to read -- of the transistor Q1 --

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*